United States Patent

[11] 3,601,787

[72] Inventor William A. Reimer
Wheaton, Ill.
[21] Appl. No. 48,061
[22] Filed June 22, 1970
[45] Patented Aug. 24, 1971
[73] Assignee GTE Automatic Electric Laboratories Incorporated

[54] SOLDER TERMINAL AND SPRING-WIRE SOLDER FORM
3 Claims, 6 Drawing Figs.

[52] U.S. Cl. 339/275 R, 174/68.5, 174/94 R, 317/101 CC, 339/17 R
[51] Int. Cl. H01r 5/04
[50] Field of Search 339/17, 18, 252, 256–258, 275; 174/68.5, 94, 94.1; 317/101 CC, 101 C; 29/625, 626, 629, 627, 630, 628, 631, 470, 484, 500–503

[56] References Cited

UNITED STATES PATENTS

| | | | |
|---|---|---|---|
| 3,258,736 | 6/1966 | Crawford et al. | 339/252 S |
| 3,466,591 | 9/1969 | Ecclesia | 339/17 M |
| 3,467,765 | 9/1969 | Croft | 174/94 |

OTHER REFERENCES

IBM Technical Disclosure Bulletin, Vol. 7, No. 6, Nov. 1964, p. 515 " Interboard Connections" by H. C. Schick

*Primary Examiner*—Stephen J. Novosad
*Assistant Examiner*—Terrell P. Lewis
*Attorneys*—Cyril A. Krenzer, K. Mullerheim, B. E. Franz and Glenn H. Antrim

ABSTRACT: A solder form facilitates replacement of receptacle terminals that extend through blind connecting through-holes of a plurality of circuit boards. A hairpin conductor within the solder form spreads apart when the form is melted to carry solder to a replacement terminal and to the conductive surface of a through-hole.

INVENTOR
WILLIAM A. REIMER
BY Glenn H. Antrim
ATTORNEY

SOLDER TERMINAL AND SPRING-WIRE SOLDER FORM

BACKGROUND OF THE INVENTION

This invention relates to solderable terminal devices for making interconnections between printed circuit boards, and particularly to spring-wire solder forms that facilitate easy replacement of terminals extending through blind connecting through-holes of the boards.

The spring-wire solder forms of this invention facilitate replacement of connectors that connect to printed wiring on a plurality of parallel printed circuit boards. For example, a structure shown in U.S. Pat. 3,466,591 issued to E. Ecclesia on Sept. 9, 1969 can be modified slightly to use the solder forms. Each one of a number of plug-in spring connectors has a straight, solderable portion extending through a plurality of interconnecting printed circuit boards and a curved spring portion for receiving a terminal edge of a removable printed-circuit board mounted perpendicular to the interconnecting boards. After the connecting board is assembled, replacement of a damaged connector or a change in wiring to the connector is impractical because the conductive through-hole for one or more of the parallel boards is not accessible for application of solder by conventional methods.

SUMMARY OF THE INVENTION

Replacement of connectors that extend through printed-circuit boards is facilitated by solder forms that contain under tension, spring-wire conductors shaped like a hairpin. A defective terminal is heated to melt solder surrounding it and is removed. An end of a new terminal and a solder form are inserted through one or more circuit boards, and then heat is applied to the terminal and the solder that is contained in the form. As the solder melts, the spring-wire tends to straighten and carries molten solder to the conductive surface of the through-holes and to the new terminal.

DESCRIPTION OF THE PREFERRED EMBODIMENTS

Figures 1, 2, 3, 4, 5, 6:
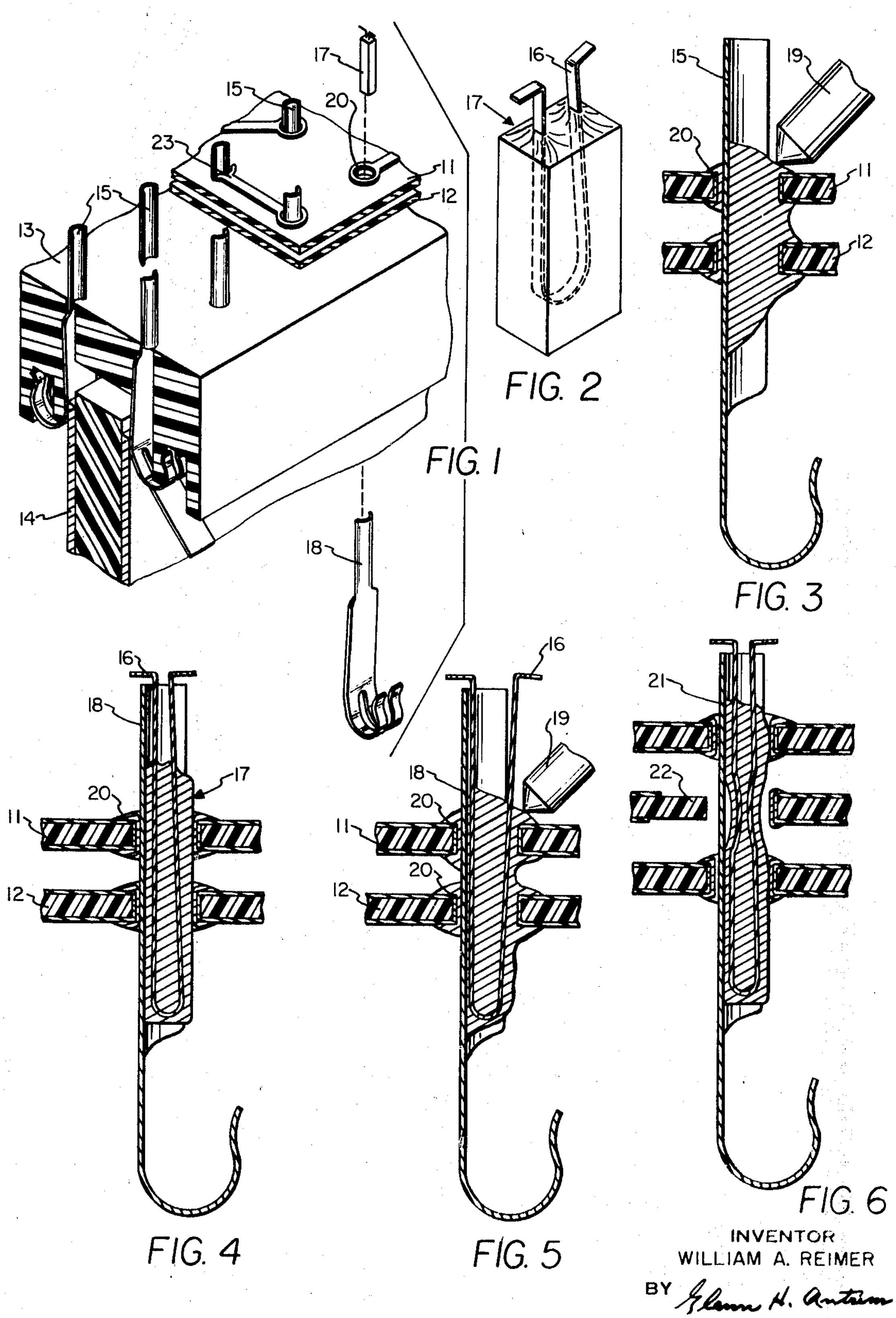
FIG. 1 is a fragmentary, oblique view of an interconnecting circuit board having terminations in connectors for plug-in printed-circuit boards.
FIG. 2 is an oblique view of a spring-wire solder form.
FIG. 3 is a cross-sectional view of a terminal to be removed from a conductive through-hole of parallel printed-circuit boards.
FIGS. 4 and 5 are cross-sectional views showing replacement of the terminal of FIG. 3 facilitated by use of a spring-wire solder form.
FIG. 6 is another cross-sectional view of installation of a terminal with a spring-wire solder form that is shaped to provide connection from the terminal to only selected ones of the parallel printed-circuit boards.

The printed interconnecting circuit board of FIG. 1, used for receiving plug-in circuit boards, is conventional except for the small modifications that are required for the use of the spring-wire solder forms of this invention. Printed wiring board receptacles 13 are attached to parallel interconnecting printed-circuit boards 11 and 12 and are adapted to receive printed-circuit boards 14 mounted perpendicular to the interconnecting boards 11 and 12. Conductive tabs arranged on the edges of printed wiring boards 14 where connections are desired to the interconnecting boards 11 and 12 engage curved spring portions of connector terminals 15 of the printed wiring board receptacle 13. The opposite ends of the terminals 15 extend through respective through-holes of the interconnecting printed-circuit boards 11 and 12 and, where required, are soldered to those portions of the printed circuits that are on the surfaces of the through-holes.

The solderable ends of the connector terminals 15 of the printed wiring board receptacles 13 that are commonly used are rectangular, but in order to retain the solder form in place before heat is applied to it, the ends of the connector terminals 15 to be used with spring-wire solder forms are preferably U-shaped or C-shaped in cross section similar to the cross section commonly used on soldering lugs to facilitate connection of wire terminals. During manufacture, the connector terminals are soldered to the interconnecting printed-circuit boards 11 and 12 by a wave-soldering method. To prevent bridging of the terminals by solder during the wave-soldering method, the surfaces of the connector terminals 15 except the inside surfaces of the U-shaped or C-shaped portions may be resistant to solder. When a connector terminal is to be replaced, the points to be soldered on the interconnecting board 12 that are located between the connector 13 and the interconnecting board 11 are obviously inaccessible for applying solder in a conventional manner. According to the present invention, a spring-wire soldering form as shown in FIG. 2 is inserted along with the soldering portion of a replacement terminal through the holes of the interconnecting printed-circuit boards 11 and 12. A conductive spring wire 16 is formed in the shape of a hairpin and the ends are brought close together under tension while a rectangular solder form is cast about the wires. The ends of the wires may be bent outwardly to form a stop, and the stop may engage the end of the connector terminal during the soldering operation. As shown in cross section in FIG. 6, the shape of the solder form may be modified by placing an indented portion having little solder where a connection is not desired on one of an assembly of parallel interconnecting printed-circuit boards.

When a connector terminal 15 of FIG. 3 is to be replaced, heat is applied by the soldering iron tip 19 to the solder of the terminal connection, and simultaneously the end of the terminal that is within the solder is pushed toward its receptacle to remove it from the interconnecting boards and the receptacle. The conductive holes from which the terminal has been removed are now already tinned and are ready to receive a replacement terminal 18 that is pushed through the printed wiring board receptacle and the holes. The spring-wire solder form of FIG. 2 is then inserted in the opposite direction with one of its longest edges contained within the curved surface of the connector terminal such that when the hairpin wire 16 is released it will press against the terminal 18 and against an opposite edge of the conductive holes.

After the terminal 18 and the solder form 17 have been inserted, heat is applied as shown in FIG. 5, and as the solder melts, the wire spring 16 tends to straighten and presses the outer edge of the replacement terminal 18 against the conductive surface 20 of the printed wiring boards 11 and 12 and carries solder to the opposite edges of these conductive surfaces. Obviously, even if solder does not span the center portion between the hairpin conductor 16, the conductor itself provides good electrical connection.

If at the terminal being replaced, a board was not previously connected, or if it is desired to disconnect a board that has previously been connected, a solder form that has an indented portion within the hole of the board that is not to be connected may be used as shown in FIG. 6. In order to prevent connection between the board 22 and the replacement terminal 21, a circumferential conductive portion of the printed wiring may be omitted adjacent the terminal at the hole of the board 22. In FIG. 1, a conductive portion 23 at a through-hole where connection may not be made is shown extending only part way around the hole for a terminal. Connection will be made when the full straight edge of a solder form is within the through-hole before heating, but will not be made if an indented portion of a solder form is within the through-hole.

I claim:

1. An interconnecting wiring assembly including a circuit board of the type having conductors on at least one surface thereof and through-holes with conductive surfaces connected to different ones of said conductors, a replacement solder terminal having a solderable portion extending through each of certain ones of said through-holes where required, a spring-wire solder form inserted in said certain through-holes between said solderable portion positioned therein and said conductive surface thereof, said solder form having a hairpin-shaped spring wire substantially enclosed by solder, the spring tension of said spring wire urging the ends thereof outwardly so that in response to application of heat to said form, the end portion of said spring wire moves outwardly to press said solderable portion against a portion of said conductive surface and to carry molten solder to the adjacent portion of said conductive surface of said through-hole and to said solderable portion of said replacement solder terminal.

2. An interconnecting wiring assembly as claimed in claim 1 including a plurality of parallel circuit boards having aligned through-holes wherein the conductive surface does not extend over a circumferential portion of selected ones of said through-holes, the solderable portion of one of said selected replacement solder terminals being positioned adjacent the nonconductive portions of said selected through-holes, and said spring-wire solder forms including their spring wires having indented portions within said selected through-holes so that when said form is heated, solder does not flow to the conductive portion of said selected through-holes and said spring wire is not in contact with said conductive portions thereof.

3. A spring-wire solder form comprising a hairpin spring wire tensioned inwardly within a solder form that is adaptable to be inserted in a connecting hole along with solderable conductors and heated to release the spring against said conductors and carry solder thereto.